US008143604B2

(12) United States Patent
Low et al.

(10) Patent No.: US 8,143,604 B2
(45) Date of Patent: *Mar. 27, 2012

(54) INSULATOR SYSTEM FOR A TERMINAL STRUCTURE OF AN ION IMPLANTATION SYSTEM

(75) Inventors: Russell Low, Rowley, MA (US); Piortr R. Lubicki, Peabody, MA (US); D. Jeffrey Lischer, Acton, MA (US); Steve Krause, Ipswich, MA (US); Eric Hermanson, Georgetown, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1583 days.

This patent is subject to a terminal disclaimer.

(21) Appl. No.: 11/394,824

(22) Filed: Mar. 31, 2006

(65) Prior Publication Data
US 2007/0235663 A1    Oct. 11, 2007

(51) Int. Cl.
*G21G 5/00*    (2006.01)
*H01J 37/08*   (2006.01)

(52) U.S. Cl. .............. 250/492.21; 250/492.2; 250/492.1
(58) Field of Classification Search ............... 250/492.1, 250/492.2, 492.21, 492.3, 423 R, 424
See application file for complete search history.

(56) References Cited

U.S. PATENT DOCUMENTS

| | | | | |
|---|---|---|---|---|
| 3,596,572 A * | 8/1971 | Matsuura | | 493/287 |
| 4,001,049 A * | 1/1977 | Baglin et al. | | 250/492.3 |
| 5,134,301 A * | 7/1992 | Kamata et al. | | 250/492.2 |
| 5,504,341 A * | 4/1996 | Glavish | | 250/492.21 |
| 5,861,226 A * | 1/1999 | Horne et al. | | 430/5 |
| 5,892,232 A * | 4/1999 | Tsai et al. | | 250/426 |
| 6,084,241 A * | 7/2000 | Sitter | | 250/492.21 |
| 6,180,954 B1* | 1/2001 | Verrier et al. | | 250/492.21 |
| 7,576,337 B2* | 8/2009 | Lubicki et al. | | 250/492.1 |
| 7,675,046 B2* | 3/2010 | Tekletsadik et al. | | 250/492.21 |
| 2002/0033511 A1 | 3/2002 | Babcock et al. | | |
| 2002/0074509 A1* | 6/2002 | Quill | | 250/432 R |
| 2002/0158213 A1* | 10/2002 | Matsunaga et al. | | 250/492.21 |
| 2005/0056793 A1* | 3/2005 | Fudoji et al. | | 250/492.3 |
| 2005/0286190 A1* | 12/2005 | Rostron et al. | | 361/65 |
| 2006/0272775 A1* | 12/2006 | Horsky et al. | | 156/345.37 |
| 2009/0057572 A1* | 3/2009 | Tekletsadik et al. | | 250/492.21 |
| 2009/0057573 A1* | 3/2009 | Low et al. | | 250/492.21 |

FOREIGN PATENT DOCUMENTS

| | | |
|---|---|---|
| JP | 06052821 | 2/1994 |
| JP | 06140191 | 5/1994 |

OTHER PUBLICATIONS

"CRC Handbook on Chemistry and Physics", 2007, Taylor and Francis Group LLC, XP002450381; pp. 15-42 to 15-46; pp. 15-44.

* cited by examiner

*Primary Examiner* — Bernard E Souw

(57) ABSTRACT

An ion implantation system includes an ion source configured to provide an ion beam, a terminal structure defining a cavity, the ion source at least partially disposed within the cavity, and an insulator system. The insulator system is configured to electrically insulate the terminal structure and is configured to provide an effective dielectric strength greater than about 72 kilovolts (kV)/inch in a region proximate at least one exterior surface of the terminal structure. A gas box insulator system to electrically insulate a gas box of the ion implantation system is also provided.

14 Claims, 12 Drawing Sheets

INSULATOR SYSTEM FOR A TERMINAL STRUCTURE OF AN ION IMPLANTATION SYSTEM

FIELD

This disclosure relates to ion implantation and, more particularly, to an insulator system for a terminal structure of an ion implantation system.

BACKGROUND

Ion implantation is a standard technique for introducing conductivity-altering impurities into semiconductor wafers. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material. The ion beam may be distributed over the wafer area by beam scanning, by wafer movement, or by a combination of beam scanning and wafer movement.

Differing kinetic energy may be imparted to the ions of the ion beam. The imparted energy, as well as other factors such as the mass of the implanting ions, may affect the implanted depth of the ions into the semiconductor wafer. In general, a lower energy would result in a shallower implant depth and a higher energy would result in a deeper implant depth with all other parameters equal.

Different ion implantation systems may utilize one or more of several methods to impart kinetic energy to the ions of the ion beam. One method of imparting energy to the ions is straight DC acceleration in which the ions are accelerated by passing them through a DC potential difference. The larger the potential difference the more energy is imparted. A mass analyzer may then receive the ion beam and may removed undesired species from the ion beam. Another magnet may collimate the beam and direct it at a wafer. Acceleration accomplished before the mass analyzer such as straight DC acceleration may be referred to as pre-acceleration, while further acceleration after or downstream from the mass analyzer may be referred to as post-acceleration. As used herein, "upstream" and "downstream" are referenced in the direction of ion beam transport.

Straight DC acceleration may utilize one or more power supplies to provide the DC potential. This may include an extraction power supply coupled to the ion source that may provide up to about 70 kilovolts (kV) in one conventional system. The ion source may be at least partially disposed in a cavity defined by a terminal structure. The terminal structure may sometimes be referred to in the art as a "terminal" or "high voltage terminal." The terminal structure may be energized to 200 kV by a separate acceleration power supply. The combination of 70 kV and 200 kV from the extraction and acceleration power supplies respectively may provide up to 270 kiloelectronvolts (keV) of energy for singly charged ions, 540 keV for doubly charge ions, and 810 keV for triply charged ions.

This 810 keV energy is suitable for many applications but may not provide enough energy for other applications. For example, some memory semiconductors such as Flash memories require higher energy ion implantation systems to create particularly deep well structures. Hence, other high-energy conventional ion implantation systems may be configured to provide energy of 1 megaelectronvolt (MeV) and greater. Such high-energy conventional ion implantation systems may utilize an accelerator downstream from the mass analyzer. The accelerator downstream from the mass analyzer may be a DC tandem-accelerator or a RF linear accelerator as are known in the art. Although effective for providing high energy, the DC tandem-accelerator and the RF linear accelerator may suffer from inefficiencies in that less than about 50% of the mass analyzed ions from the mass analyzer may be available for implantation in the semiconductor wafer.

The ion implantation system may also include an enclosure to protect components and sub-systems of the ion implantation system and to protect personnel from high voltage dangers when the ion implantation system is operating. It is desirable to limit the size of the enclosure or "footprint" in order to save space in a manufacturing facility where space is costly. It is also desirable to make transportation of components and sub-systems less cumbersome. Most conventional straight DC acceleration methods used in volume manufacturing of semiconductors have limited the voltage of the terminal structure to 200 kV since only air is used to insulate the terminal structure from the enclosure and footprint constraints limit the distance of the enclosure from the terminal structure.

Accordingly, it would be desirable to provide an insulator system for the terminal structure of the ion implantation system. It would also be desirable to energize the terminal structure to high voltages with a reasonably sized enclosure footprint.

SUMMARY

According to a first aspect, an ion implantation system is provided. The ion implantation system includes an ion source configured to provide an ion beam, a terminal structure defining a cavity, the ion source at least partially disposed within the cavity, and an insulator system to electrically insulate the terminal structure. The insulator system is configured to provide an effective dielectric strength greater than about 72 kilovolts (kV)/inch in a region proximate at least one exterior surface of the terminal structure.

According to another aspect, another ion implantation system is provided. The ion implantation system includes an ion source configured to provide an ion beam, a gas box configured to provide gas to be ionized in the ion source, a terminal structure defining a cavity. The ion source and the gas box are at least partially disposed within the cavity. The ion implantation system also includes a terminal structure insulator system to electrically insulate the terminal structure. The terminal structure insulator system is configured to provide an effective dielectric strength greater than about 72 kilovolts (kV)/inch in a region proximate at least one exterior surface of said terminal structure. The ion implantation system also includes a gas box insulator system configured to electrically insulate the gas box. The gas box insulator system includes at least one solid insulator having at least one side contacting an associated exterior surface of the gas box. The ion implantation system also includes a mass analyzer positioned downstream of the ion source, the mass analyzer configured to remove undesired species from the ion beam, and an end station positioned downstream of the mass analyzer, the end station including a platen having a surface to support a wafer thereon.

BRIEF DESCRIPTION OF THE DRAWINGS

For a better understanding of the present disclosure, reference is made to the accompanying drawings, which are incorporated herein by reference and in which.

DETAILED DESCRIPTION

The invention is described herein in connection with an ion implantation system for implanting semiconductor wafers. However, the invention can be used with other ion implantation systems for implanting differing workpieces such as flat panel displays. Thus, the invention is not limited to the specific embodiments described below.

Figure 1:
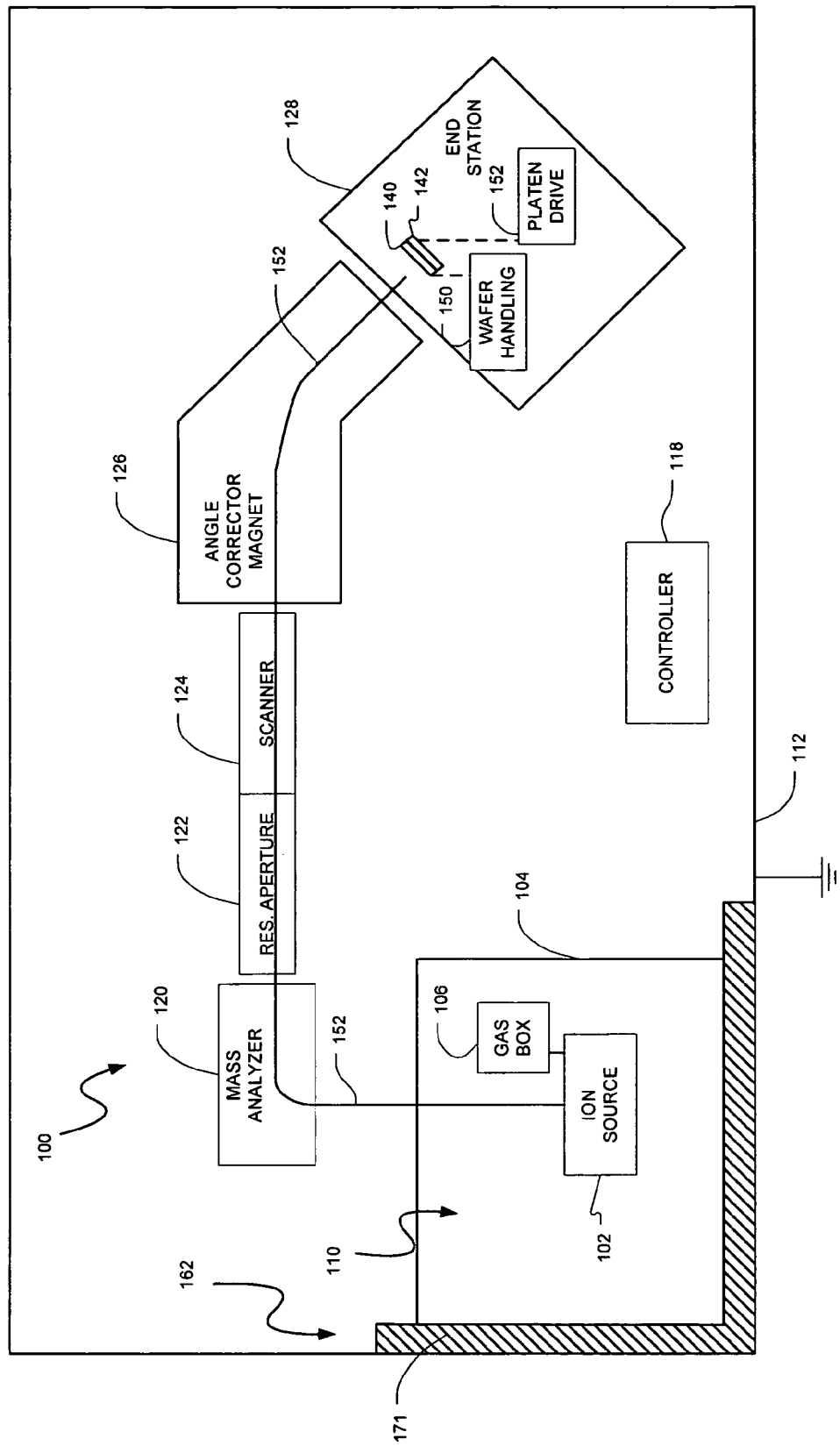
FIG. 1 is a schematic block diagram of an ion implantation system.

FIG. 1 illustrates a block diagram of an ion implantation system 100. The ion implantation system 100 includes an ion source 102 configured to provide an ion beam 152. The ion source 102 may generate ions and may include an ion chamber that accepts gas from the gas box 106. The gas box 106 may provide a gas to be ionized to the ion chamber. In addition to containing source gases, the gas box 106 may also contain other components known in the art such as power supplies. The power supplies may include arc, filament, and bias power supplies for running the source 102. The gas box 106 may also be raised in potential via an isolation transformer. A power distribution panel may also be included in the gas box 106 for power distribution of the source power supplies. The ions thus formed in the source 102 may then be extracted from the ion source 102. The construction and operation of ion sources are well known to those skilled in the art.

The ion implantation system 100 also includes a terminal structure 104 which may sometimes be referred to in the art as a "terminal" or a "high voltage terminal." The terminal structure 104 may define a cavity 110 and the ion source 102 may be at least partially disposed within the cavity 110. The ion implantation system 100 may further include an insulator system 162 to electrically insulate the terminal structure 104. The insulator system 162 is configured to provide an effective dielectric strength greater than about 72 kilovolts (kV)/inch in a region proximate at least one exterior surface of the terminal structure 104.

In one instance, the insulator system 162 may include at least one insulator 171 having a dielectric strength greater than about 72 kV/inch. The at least one insulator 171 may be a solid insulator, a liquid insulator, or a pressurized gas as further detailed in embodiments herein. The insulator system 162 may also include combinations of solids, liquids, pressurized gases, and air. The ion implantation system 100 may also include an enclosure 112. The enclosure 112 may define an interior volume and the terminal structure 104 may be disposed therein.

During operation of the ion implantation system 100, the terminal structure 104 may be energized, in some instances, to at least 300 kV. In other instances, the terminal structure 104 may be energized to 600 kV and in still other instances the terminal structure 104 may not be energized at all or energized to nominal values only depending on the desired energy of the ion beam. The insulator system 162 may have a sufficient dielectric strength to electrically insulate the terminal structure 104 from an electrical ground of the enclosure 112 without dielectric breakdown.

The terminal structure 104 and associated insulator system 162 may be utilized in many different ion implantation systems known to those skilled in the art. The ion implantation system 100 of FIG. 1 is one embodiment of an ion implantation system and is provided by way of example only and is not intended to be limiting. The ion implantation system 100 of FIG. 1 may further include a mass analyzer 120, a resolving aperture 122, a scanner 124, an angle corrector magnet 126, an end station 128, and a controller 118.

The mass analyzer 120 may include a resolving magnet that deflect ions so that ions of a desired species pass through the resolving aperture 122 and undesired species do not pass through the resolving aperture 122. In one embodiment, the mass analyzer 120 may deflect ions of the desired species by 90 degrees and deflect ions of undesired species by differing amounts due to their different masses. A scanner 124 positioned downstream from the resolving aperture 122 may include scanning electrodes as well as other electrodes for scanning the ion beam. The angle corrector magnet 126 deflects ions of the desired ion species to convert diverging ion beam paths to nearly collimated ion beam paths having substantial parallel ion trajectories. In one embodiment, the angle corrector magnet 126 may deflect ions of the desired ion species by 45 degrees.

The end station 128 may support one or more wafers in the path of the ion beam such that ions of the desired species are implanted into the wafer 140. The wafer 140 may be supported by a platen 142. The end station 128 may include other components and sub-systems known in the art such as a wafer handling system 150 to physically move the wafer 140 to and from the platen 142 from various holding areas. When the wafer handling system 150 moves the wafer 140 to the platen 142 from a holding area, the wafer 140 may be clamped to the platen 142 using known techniques, e.g., electrostatic wafer clamping where the wafer is clamped to the platen with electrostatic forces or mechanical clamping where the wafer is clamped to the platen with mechanical forces. The end station 128 may also include a platen drive system 152 as is known in the art to move the platen 142 in a desired way. The platen drive system 152 may be referred to in the art as a mechanical scan system.

The controller 118 may receive input data from components of the ion implantation system 100 and control the same. For clarity of illustration, input/output paths from the controller 108 to components of the system 100 are not illustrated in FIG. 1. The controller 118 can be or include a general-purpose computer or network of general-purpose computers that may be programmed to perform desired input/output functions. The controller 118 can also include other electronic circuitry or components, such as application specific integrated circuits, other hardwired or programmable electronic devices, discrete element circuits, etc. The controller 118 may also include user interface devices such as touch screens, user pointing devices, displays, printers, etc. to allow a user to input commands and/or data and/or to monitor the ion implantation system 100. The controller 118 may also include communication devices and data storage devices.

The ion beam 152 provided to a surface of the wafer 140 may be a scanned ion beam. Other ion implantation systems may provide a spot beam or a ribbon beam. The spot beam in one instance may have an approximately circular cross-section of a particular diameter depending on the characteristics of the spot beam. The ribbon beam may have a large width/height aspect ratio and may be at least as wide as the wafer 140. The scanner 124 would not be required for systems using a ribbon beam or a stationary spot beam. The ion beam 152 can be any type of charged particle beam, such as an energetic ion beam used to implant the wafer 140. The wafer 140 can take various physical shapes such as a common disk shape. The wafer 140 can be a semiconductor wafer fabricated from any type of semiconductor material such as silicon or any other material that is to be implanted using the ion beam 152.

Figure 2:
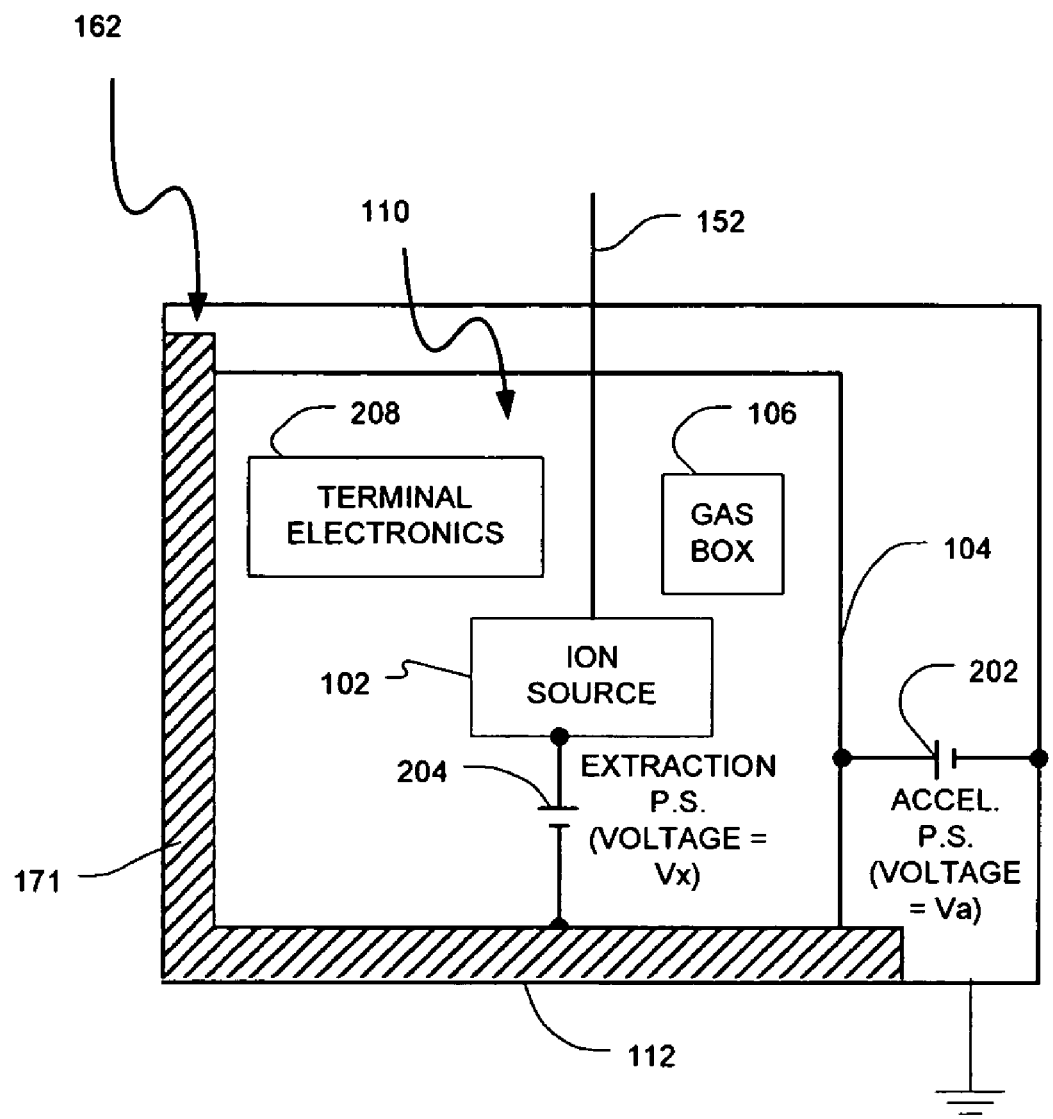
FIG. 2 is a schematic block diagram of the terminal structure of FIG. 1.

Turning to FIG. 2, a schematic block diagram of the terminal structure 104 of FIG. 1 is shown in more detail. Within the cavity 110 defined by the terminal structure 104 may be the ion source 102, the gas box 106, and terminal electronics 208 to control operation of the components within the terminal structure 104. The terminal electronics 208 may also be capable of communicating with the controller 118.

An extraction power supply 204 may be coupled to the ion source 102. The extraction power supply 204 may provide a DC voltage level (Vx) to accelerate and extract ions from the ion source 102. The extraction power supply may provide a DC voltage (Vx) in the range of 20 kV to 120 kV.

An additional acceleration power supply 202 may be coupled between the terminal structure 104 and a ground plane such as the enclosure 112 so as to bias the terminal structure 104 at a positive voltage (Va) with respect to ground. The acceleration power supply 202 may provide an additional DC voltage level (Va) that may have a maximum voltage in the range of 200 kV to 1,000 kV, and may be 600 kV in one embodiment. Accordingly, the terminal structure 104 may be energized, in some instances, to a high voltage between 200 kV and 1,000 kV, and 600 kV in one embodiment. In other instances, the terminal structure 104 may not be energized at all or energized to nominal values only depending on the desired energy of the ion beam. Although only one acceleration power supply 202 is illustrated for clarity of illustration, two or more power supplies may be utilized to provide the desired maximum high voltage level (Va).

The wafer 140 may be at ground potential. Therefore, the implant energy for singly charged ions is given by the potential of the ion source 102 with respect to ground which is the acceleration voltage (Va) from the acceleration power supply plus the extraction voltage (Vx) from the extraction power supply (Va+Vx). For example, if the extraction voltage is 80 kV and the acceleration voltage is 600 kV, the implant energy of a singly charged ion beam is 680 keV without the use of any accelerator downstream from the mass analyzer 120 to provide additional energy.

Figure 3:
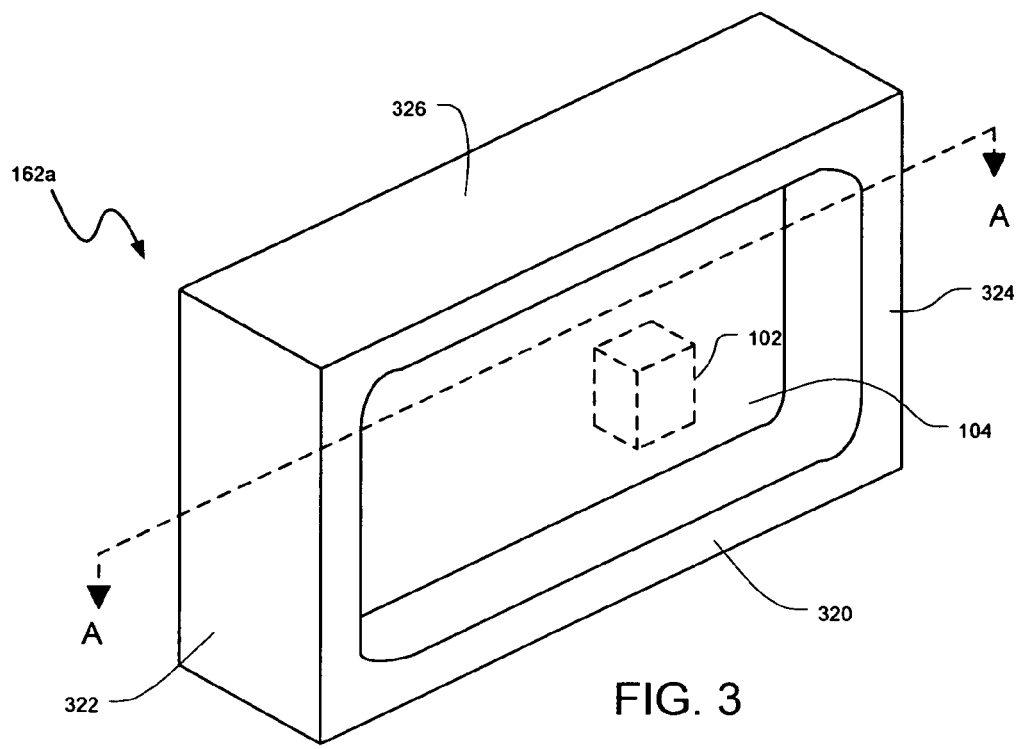
FIG. 3 is a perspective view of a first embodiment of an insulator system having four sides fabricated of a solid insulator.

FIG. 3 is a perspective view of a first embodiment of an insulator system 162a having a solid insulator with four sides. The four sides include a base 320, a first upstanding sidewall 322 coupled to one end of the base 320, a second upstanding sidewall 324 coupled to another end of the base 320, and a top 326. The solid insulator may have a dielectric strength greater than 72 kV/inch. Each of the four sides may be fabricated from one piece, e.g., a monolithic structure. Alternatively, each of the four sides may be individually fabricated and joined together to form the four sided structure of the insulator system 162a. Fabricating the insulator system 162a with one piece would reduce the risk of having trapped air, e.g., air bubbles, formed at the joints between the four sides.

The solid insulator may include, but not be limited to, a polyethylene or a low-density polyethylene. The polyethylene may have a dielectric strength of about 500 kV/inch. The solid insulator may also be a one-piece molded plastic. In one embodiment, the one-piece molded plastic may have a dielectric strength of 200 kV/inch such that a 3-inch thickness would permit a voltage drop of 600 kV. The solid insulator may also be syntactic foam. The syntactic foam may include hollow glass spheres and/or polymer pellets dispersed about a filling compound such as epoxy or silicon. The syntactic foam may have a dielectric strength less than that of the one-piece molded plastic, e.g., 100 kV/inch in one embodiment. Therefore, for a voltage drop of 600 kV, the syntactic foam may require a thickness of about 6 inches. Although thicker than the one-piece molded plastic and polyethylene, the syntactic foam may be less expensive and lighter compared to both. Furthermore, the solid insulator may also include polytetrafluoroethylene (PTFE), chlorinated polyvinyl chloride (CPVC), polyvinylidene difluoride (PVDF), silicone, fiberglass, or epoxy.

The terminal structure 104 may be disposed within an interior volume defined by the four sides of the insulation system 162a such that each of the four sides contact an associated exterior surface of the terminal structure 104. The terminal structure 104 may have a variety of geometries and may have a substantially rectangular cross sectional shape in one embodiment. The terminal structure 104 may be fabricated of various materials including, but not limited to, conductive materials such as metallic materials. The terminal structure 104 may define a cavity 110 and various components may be at least partially disposed within the cavity 110 including the ion source 102 illustrated in phantom and the gas box 106 (not illustrated in FIG. 3).

Figure 4:
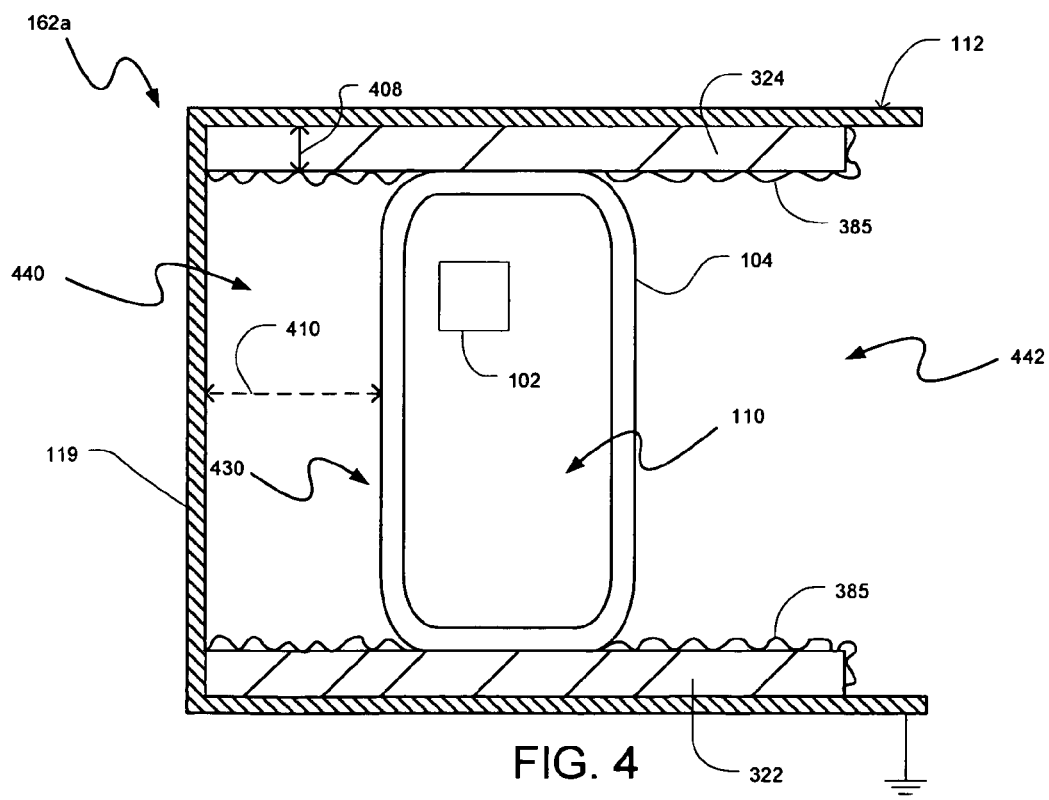
FIG. 4 is a cross sectional view of the first embodiment taken along the line A-A of FIG. 3.

FIG. 4 is a cross sectional view of the first embodiment of the insulator system 162a taken along the line A-A of FIG. 3.

The enclosure 112 at ground potential is also illustrated. The first upstanding sidewall 322 and second upstanding sidewall 324 of the four sided insulator system may contact associated exterior surfaces of the terminal structure 104 to insulate respective sides of the terminal structure. The insulator system 162a may also have a first opening 440 defined by sections of the base 320, the first and second upstanding walls 322, 324, and the top 326. The insulator system 162a may also have a second opening 442 defined by opposing sections of the base 320, the first and second upstanding walls 322, 324, and the top 326. Air may be used as an insulator for these openings 440, 442. Using air as an insulator provides operating personnel access to the terminal structure 104 and components therein.

Since air is used as an insulator to insulate the exterior rear surface 430 of the terminal structure from the rear wall 119 of the enclosure 112, the rear wall 119 should be positioned a sufficient distance 410 from the surface 430. The distance 410 should depend, at least in part, on the maximum expected DC voltage level of the terminal structure 104. The distance 410 should be great enough to electrically insulate the rear surface 430 of the terminal 104 from electrical ground of the rear wall 119 of the enclosure 112. Air may have a dielectric strength of about 72 kV/inch under assumed conditions. This dielectric strength may change with relative humidity, altitude above sea level of the particular location of the ion implantation system (i.e., air pressure), separation distance, and electrode surface finish. As a safety measure to account for such variations, a dielectric strength of 32 kV/inch for air may be utilized as a design rule. For example, if the terminal structure 104 is energized to a maximum of 600 kV, the distance 410 may be selected to be 18.75 inches using the 32 kV/inch design rule.

The dielectric strength of the solid insulator of the upstanding walls 322, 324 (and the base 320 and top 326) may be designed to permit a voltage drop across the walls 322, 324 equal to the maximum expected DC voltage level of the terminal structure 104. In one embodiment, the solid insulator of the upstanding walls 322, 324 may contact an associated exterior surface of the terminal structure. The solid insulator of the upstanding walls 322, 324 may also contact the grounded enclosure 112. A thickness 408 of the upstanding wall 324 may therefore vary depending on the maximum expected DC voltage level of the terminal structure 104 and the dielectric strength of the particular solid insulator selected for the upstanding wall 324. For example, if the maximum expected DC voltage level of the terminal structure 104 is 600 kV and the reliable dielectric strength of the upstanding wall is 200 kV/inch, then the wall should have a thickness 408 of 3 inches.

Since charges may migrate along an interior surface of the upstanding walls 322, 324, the interior surface may be fabricated with a rippled or corrugated surface 385 to effectively increase the tracking length for the migrating charge. Assuming a tracking length requirement of 10 kV/inch, a length of a smooth interior surface of the sidewalls 322, 324 would be 60 inches for a terminal 104 energized to 600 kV. The rippled or corrugated surface 385 may enable this length to be decreased by a factor of 3 or to about only 20 inches. The interior surface of the base 320 and top 326 may similarly be fabricated with a rippled or corrugated surface.

Figure 5:
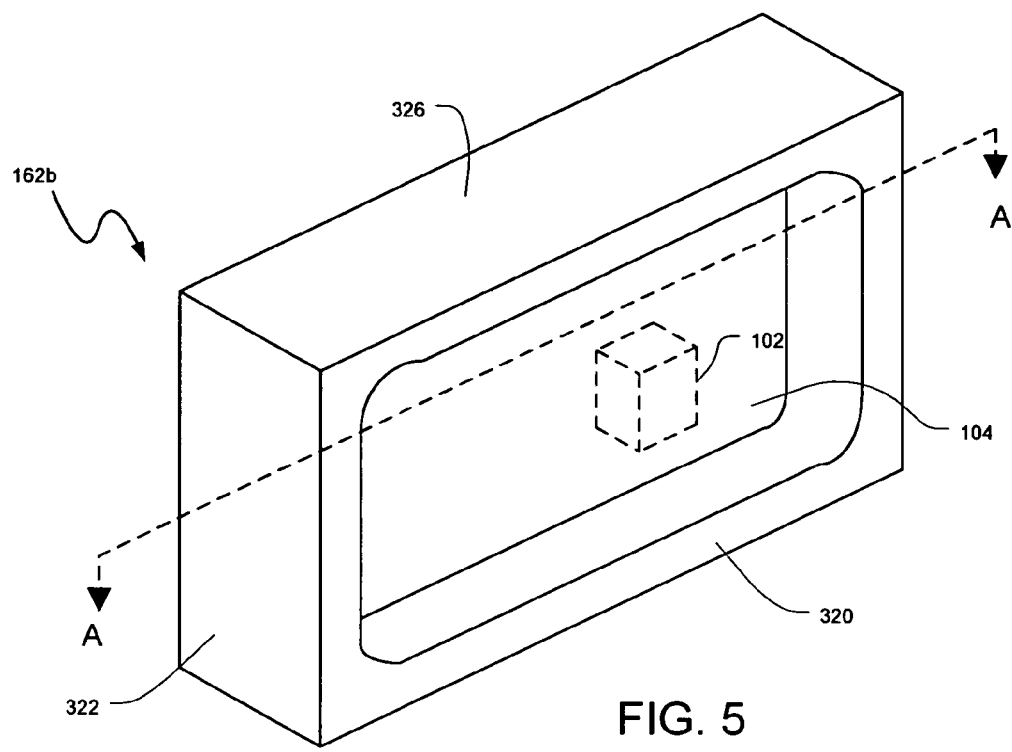
FIG. 5 is a perspective view of a second embodiment of an insulator system having five sides fabricated of a solid insulator.
Figure 6:
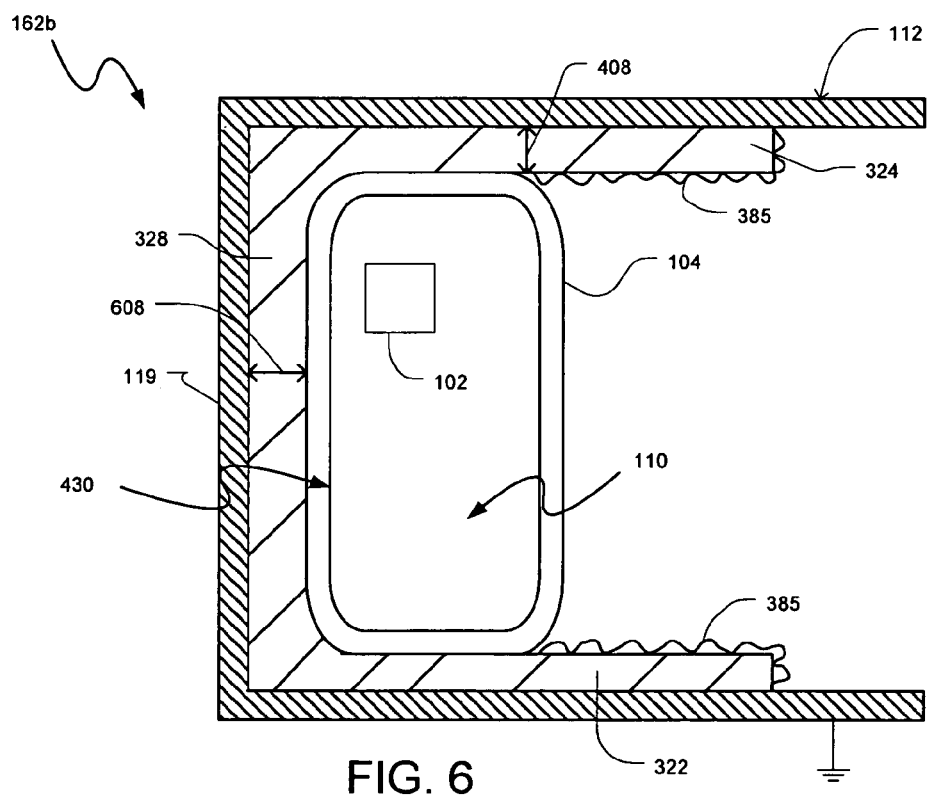
FIG. 6 is a cross sectional view of the second embodiment taken along the line A-A of FIG. 5.

FIG. 5 is a perspective view of a second embodiment of an insulator system 162b having a solid insulator with five sides, and FIG. 6 is a cross sectional view of the second embodiment taken along the line A-A of FIG. 5. Similarly to the first embodiment, each of the five sides may be fabricated from one piece, e.g., a monolithic structure, to reduce the risk of trapped air forming at joints. Alternatively, each of the five sides may be individually fabricated and joined together to form the five sided structure of the insulator system 162a.

Compared to the first embodiment of FIGS. 3 and 4, the insulator system 162b of the second embodiment of FIGS. 5 and 6 has an additional rear upstanding wall 328 (see FIG. 6). The upstanding rear wall 328 may be coupled to the rear of the base 320, to the first upstanding wall 322, the second upstanding wall 324, and the rear of the top 326. Other components of the second embodiment similar to the first embodiment of FIGS. 4 and 5 are labeled similarly and hence any repetitive description is omitted herein for clarity.

Since the second embodiment uses the rear upstanding wall 328, the rear wall 119 of the enclosure 112 may contact an exterior surface of the rear upstanding wall 328. The thickness 608 of the rear upstanding wall 328 may be selected similarly to the thickness 408 of the first upstanding wall 324. That is, the thickness 608 may be selected to permit a voltage drop across the rear upstanding wall 328 equal to the maximum expected DC voltage level of the terminal structure 104. Therefore, the thickness 608 may vary depending on the maximum expected DC voltage level of the terminal structure 104 and the dielectric strength of the particular dielectric chosen for the rear upstanding wall 328.

Alternatively, the rear upstanding wall 328 of the insulator system 162b may contact the rear wall 119 of the enclosure 112 only and an air gap may be formed between the rear upstanding wall 328 and the terminal 104. However, the rear upstanding wall 328 would still need to stand off a significant voltage level of the terminal structure 104 in this instance.

Figure 7:
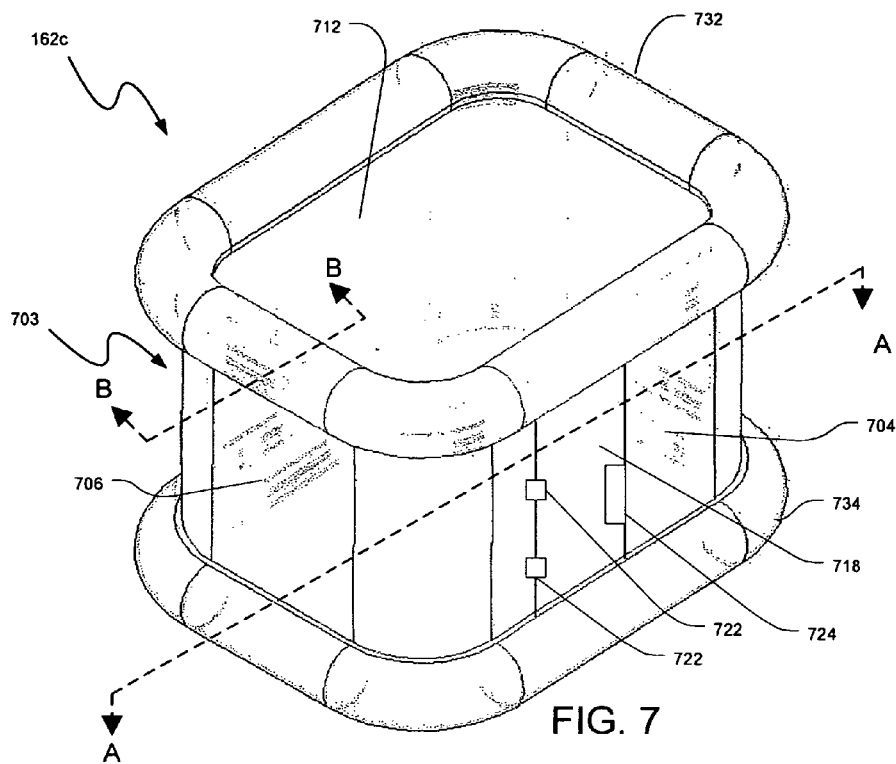
FIG. 7 is a perspective view of a third embodiment of an insulator system.
Figure 8:
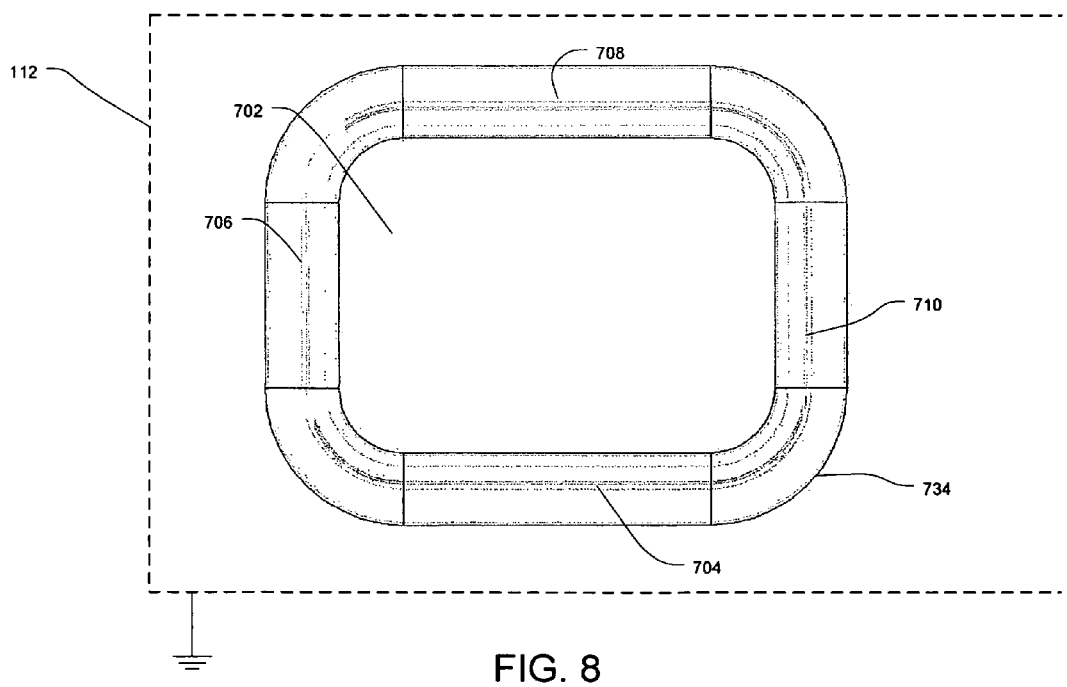
FIG. 8 is a cross sectional view of the third embodiment taken along the line A-A of FIG. 7.

FIG. 7 is a perspective view of a third embodiment of an insulator system 162c, and FIG. 8 is a cross sectional view of the third embodiment of the insulator system 162c taken along the line A-A of FIG. 7. The insulator system 162c may include insulators 732, 734 disposed about a portion of an exterior surface of the terminal structure 703. Air may be utilized to insulate a remainder of the exterior surface of the terminal structure 703. In general, the solid insulators 732, 734 may be disposed about portions of the exterior surface of the terminal structure 703 that have excess electrical stresses, e.g., such as edges and corners. Other terminal structures may have additional portions, e.g., vertical edges, which require additional solid insulators.

The terminal structure 703 may include a base 702, four upstanding walls 704, 706, 708, 710 coupled to the base 702, and a top 712. The four upstanding walls 704, 706, 708, 710 may be fabricated of one solid material piece or any plurality of separate pieces. The insulator 732 may be disposed about the junction of the upstanding walls 704, 706, 708, 710 with the top 712, while the insulator 734 may be disposed about the junction of the upstanding walls 704, 706, 708, 710 with the base 702. The insulators 732, 734 may be solid insulators. In one embodiment, the insulators 732, 734 may have a substantially tubular geometry.

Figure 8A:
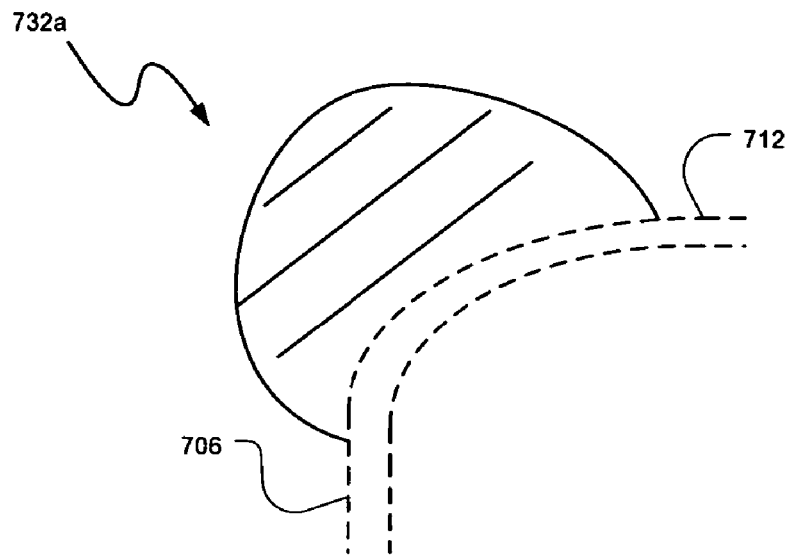
FIG. 8A is a cross sectional view of one embodiment of the insulator of FIG. 7 taken along the line B-B of FIG. 7.
Figure 8B:
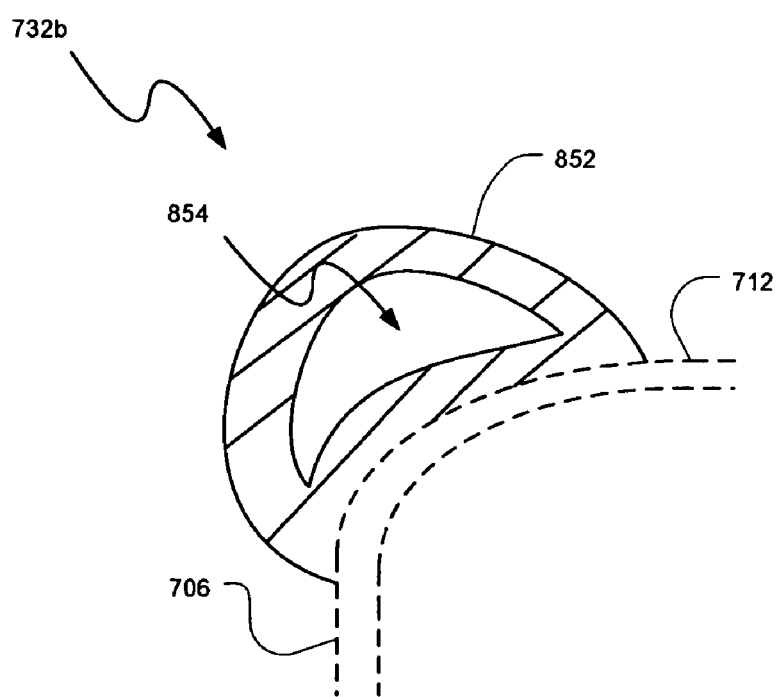
FIG. 8B is a cross sectional view of another embodiment of the insulator of FIG. 7 taken along the line B-B of FIG. 7.

The solid insulators 732, 734 may include, but not be limited to, any of the solid insulators detailed with respect to the embodiment of FIG. 3 such as polyethylene, syntactic foam (silicone or epoxy based with glass microballoons), polytetrafluoroethylene (PTFE), chlorinated polyvinyl chloride (CPVC), or polyvinylidene difluoride (PVDF). In one embodiment, the solid insulators 732, 734 may be solid material throughout an entire cross section of the insulators 732, 734. For instance, FIG. 8A illustrates a cross sectional view of one embodiment 732a of the solid insulator 732 along the line B-B of FIG. 7 having a solid dielectric material throughout an entire cross section of the insulator 732a to insulate the junction of the sidewall 706 and top 712 which are both illustrated in phantom. Alternatively, the insulator 732 may have an outer solid insulator 852 that defines an internal cavity 854 as illustrated in the embodiment 732b of FIG. 8B. The internal cavity 854 may be filled with gas. In one embodiment, the gas may be pressurized air. In some instances, a gas such as carbon dioxide ($CO_2$) or sulphur hexafluoride ($SF_6$) may be utilized and such gases may not need to be pressurized depending on their non pressurized dielectric strength.

During operation of the ion implantation system, the terminal structure 703 may be energized to at least 200 kilovolts (kV). In one embodiment, one or more of the four upstanding walls may have a portion 718 that has at least one hinge 722 and locking mechanism 724 to serve as a door for permitting personnel access to the interior cavity of the terminal structure 703.

Figure 9:
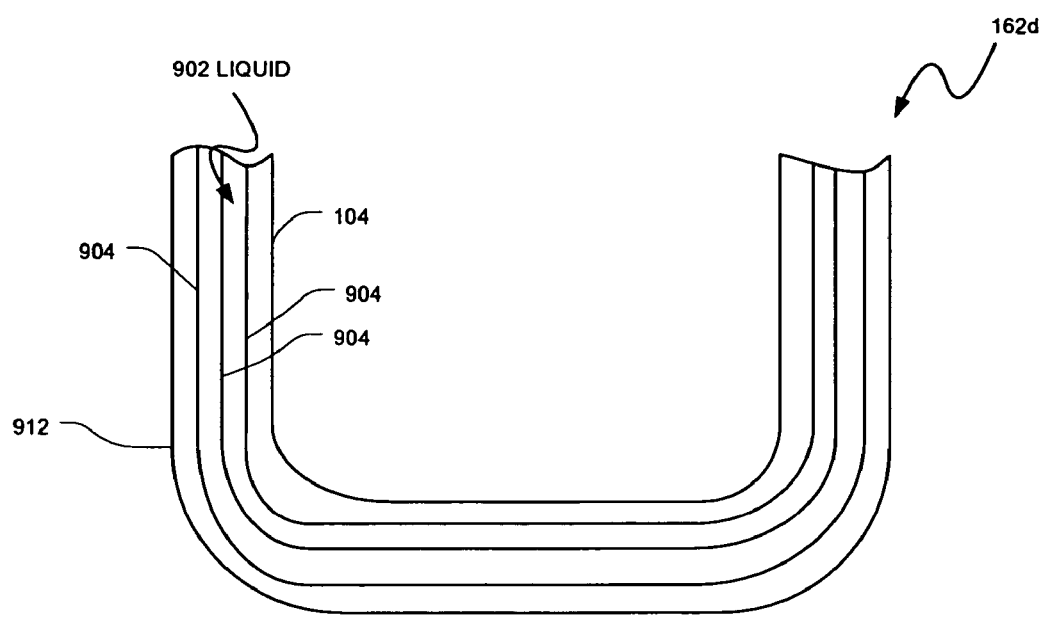
FIG. 9 is a cross sectional view of a fourth embodiment of an insulator system having a liquid insulator.

FIG. 9 is a cross sectional view of a fourth embodiment of an insulator system 162d having a liquid insulator 902. A liquid tight cavity may be formed between an exterior surface of the terminal structure 104 and an enclosure 912. A liquid insulator 902 may be disposed within this liquid tight cavity. The liquid insulator 902 may include, but not be limited to, oil. A solid such as paper 904 may also be disposed within the liquid insulator 902 to enhance the dielectric properties of the liquid. The paper 904 may first be tightly wrapped about the terminal structure 104 and a liquid insulator 902 such as oil may be forced into the liquid tight cavity in between the sheets of paper 904.

Figure 10:
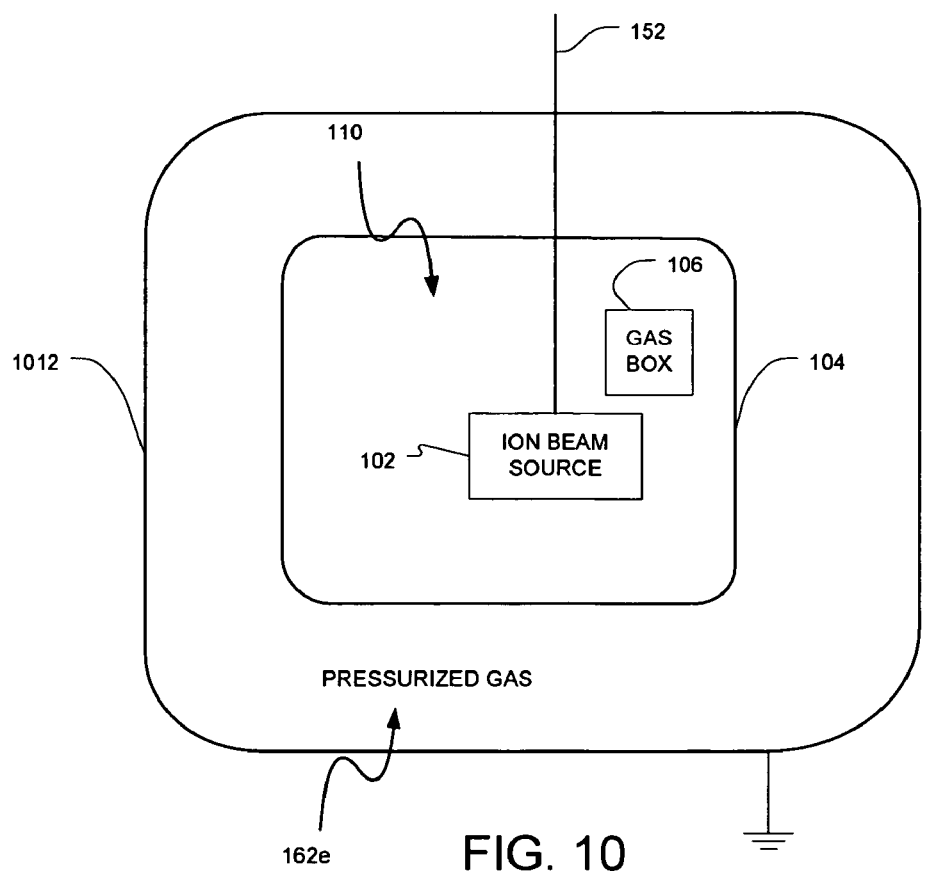
FIG. 10 is a schematic block diagram of a fifth embodiment of an insulator system having a pressurized gas insulator.

FIG. 10 is a schematic block diagram of a fifth embodiment of an insulator system 162e having a pressurized gas insulator. The pressurized gas may include, but not be limited to, air, $CO_2$, or $SF_6$. An enclosure 1012 may be fabricated of a suitable material and structure to withstand the selected pressure of the gas. The enclosure 1012 may enclose the terminal structure 104. A chamber may therefore be defined by an interior surface of the enclosure 1012 and the exterior surfaces of the terminal structure 104. The pressurized gas may be disposed in the chamber so that the pressurized gas insulates the terminal structure 104 from an electrical ground of the enclosure 1012. For the same pressure, $CO_2$ has a slightly higher dielectric strength than air. The dielectric strength of gases is relatively linear with pressure over the pressure range of interest, e.g., if the gas pressure is increased the dielectric strength increases linearly therefore allowing shorter distances between the terminal structure 104 and the grounded enclosure 1012.

A terminal structure insulator system consistent with an embodiment may allow an ion implantation system to utilize only straight DC acceleration for higher implant energies while maintaining or decreasing the footprint size of the enclosure of the ion implantation system. This may also eliminate the need for an accelerator positioned downstream from the mass analyzer such as the DC tandem-accelerator or the RF linear accelerator and hence the cost, complexities, and inefficiencies associated with such accelerators.

Figure 11:
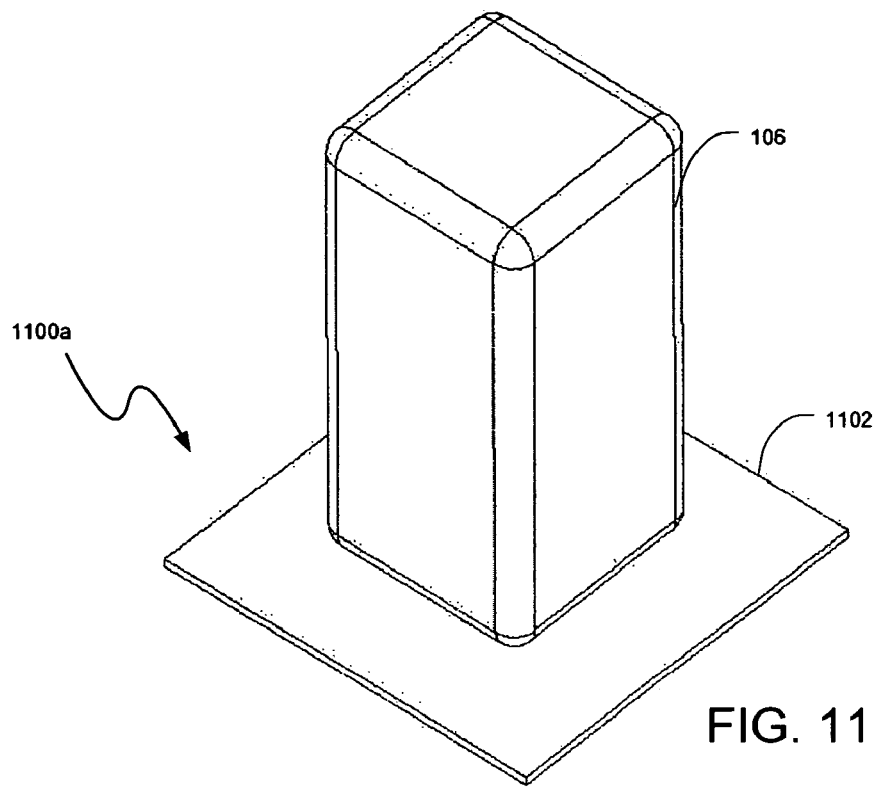
FIG. 11 is a perspective view of the gas box of FIG. 1 having a gas box insulator system according a first embodiment with one side.

Turning to FIG. 11, a perspective view of the gas box 106 of FIG. 1 with a gas box insulator system 1100a according to a first embodiment is illustrated. The gas box 106 may be energized to between 40 kV and 120 kV. In general, the gas box insulator system is configured to provide an effective dielectric strength greater than about 72 kilovolts (kV)/inch in a region proximate at least one exterior surface of the gas box 106. Although illustrated as a solid insulator in FIG. 11, the at least one insulator may be a liquid insulator, a pressurized gas, or a combination of solids, liquids, pressurized gases, and air similar to that earlier detailed for the terminal structure insulator system embodiments. For example, a combination of a solid insulator and air similar to the terminal structure insulator system of FIGS. 7, 8, 8A, and 8B may be utilized. In this instance, the solid insulator may be disposed about portions of the exterior surface of the gas box 106 that have excess electrical stresses, e.g., such as edges and corners, and air may be otherwise utilized.

In the first embodiment of FIG. 11, the gas box insulator system 1100a may include a solid insulator having one side 1102 contacting an associated exterior bottom surface of the gas box 106. The one side 1102 of the solid insulator may be planar shaped and act as a base upon which the gas box 1106 may rest as illustrated in FIG. 11.

The solid insulator material may include, but not be limited to, any of the solid insulators detailed with respect to the embodiment of FIG. 3. In particular, the solid insulator may be polyethylene, a low-density polyethylene, syntactic foam, solid epoxy, PTFE, CPVC, PVDF, or fiberglass to name several. The thickness of the base 1102 of the solid insulator may be selected in response to the maximum expected DC voltage of the gas box 106 and the dielectric strength of the particular solid insulator selected.

Figure 12:
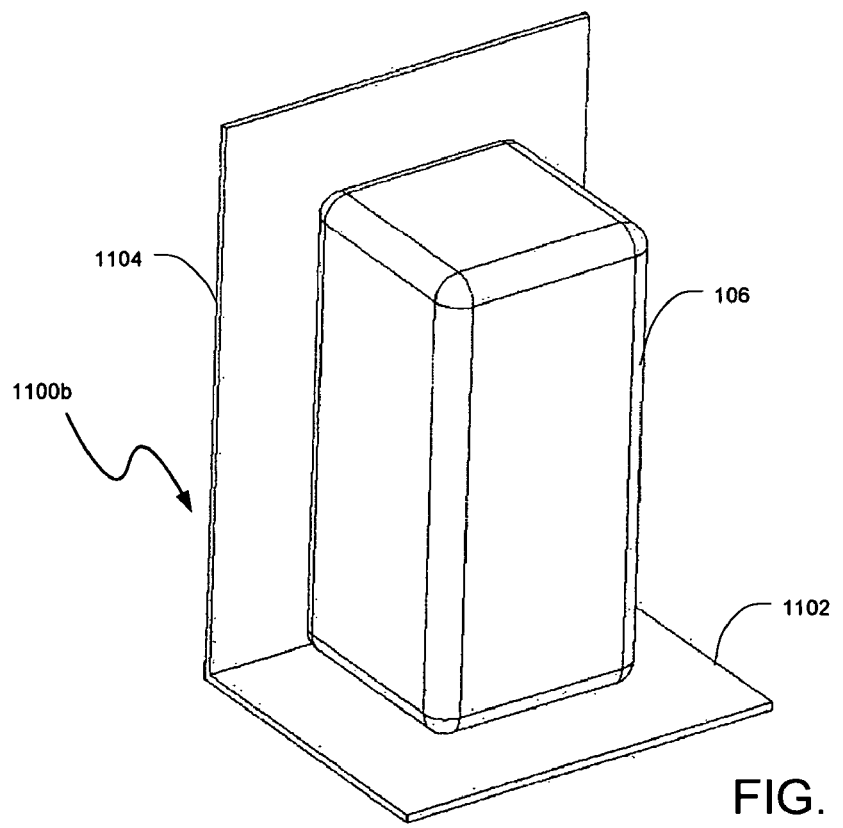
FIG. 12 is a perspective view of the gas box of FIG. 1 having a gas box insulator system according to a second embodiment with two sides.

FIG. 12 is a perspective view of the gas box of FIG. 1 having a gas box insulator system 1100b according to a second embodiment. The gas box insulator system 1100b may include a solid insulator having two sides including the base 1102 and a first upstanding sidewall 1104. Each of the sides 1102, 1104 may contact an associated exterior surface of the gas box 106. Similar to the earlier terminal structure insulator systems, each of the sides 1102, 1104 of this and other multiple side embodiments may be fabricated from one piece, e.g., a monolithic structure, to reduce the risk of trapped air forming at joints. Alternatively, each of the sides may be individually fabricated and joined together.

Figure 13:
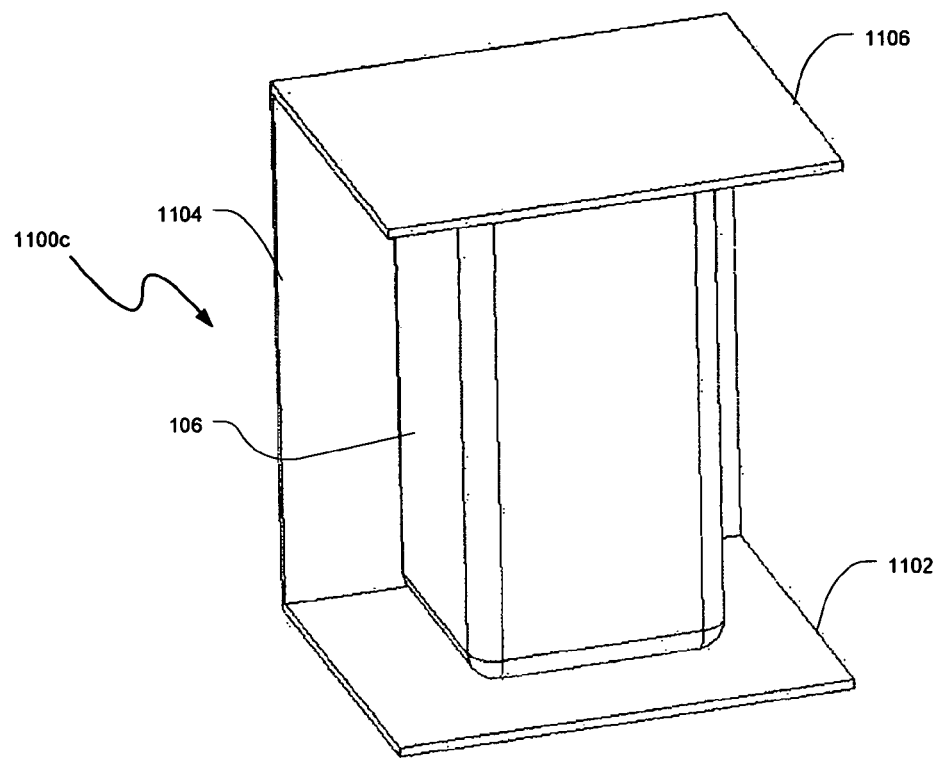
FIG. 13 is a perspective view of the gas box of FIG. 1 having a gas box insulator system according to a third embodiment with three sides.

FIG. 13 is a perspective view of the gas box of FIG. 1 having a gas box insulator system 1100c according to a third embodiment. The gas box insulator system 1100c may include a solid insulator having three sides including the base 1102, the first upstanding sidewall 1104, and a top 1106. Each of the sides 1102, 1104, 1106 may contact an associated exterior surface of the gas box 106.

Figure 14:
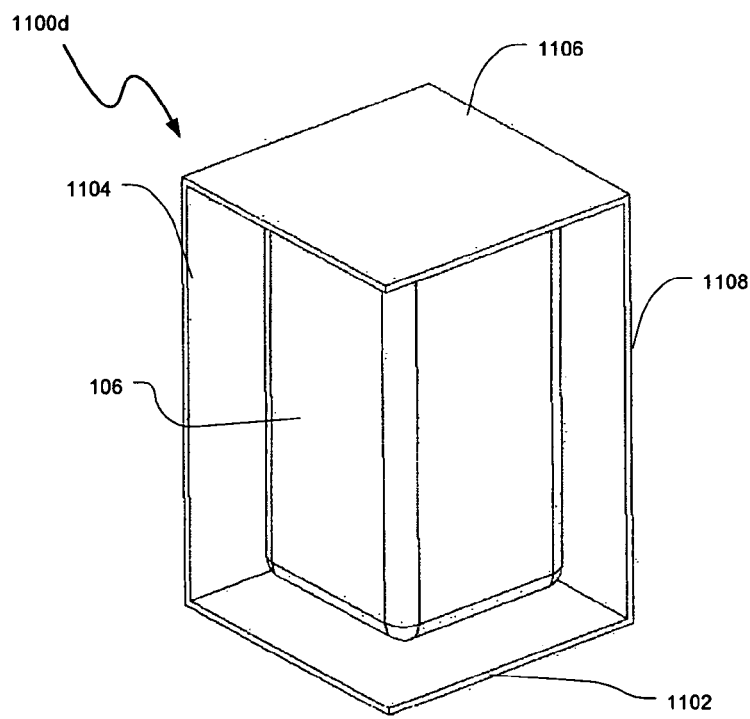
FIG. 14 is a perspective view of the gas box of FIG. 1 having a gas box insulator system according to a fourth embodiment with four sides.

FIG. 14 is a perspective view of the gas box of FIG. 1 having a gas box insulator system 1100d according to a fourth embodiment. The gas box insulator system 1100d may include a solid insulator having four sides including the base 1102, the first upstanding sidewall 1104, a second upstanding sidewall 1108, and the top 1106. Each of the sides 1102, 1104, 1106, 1108 may contact an associated exterior surface of the gas box 106.

Figure 15:
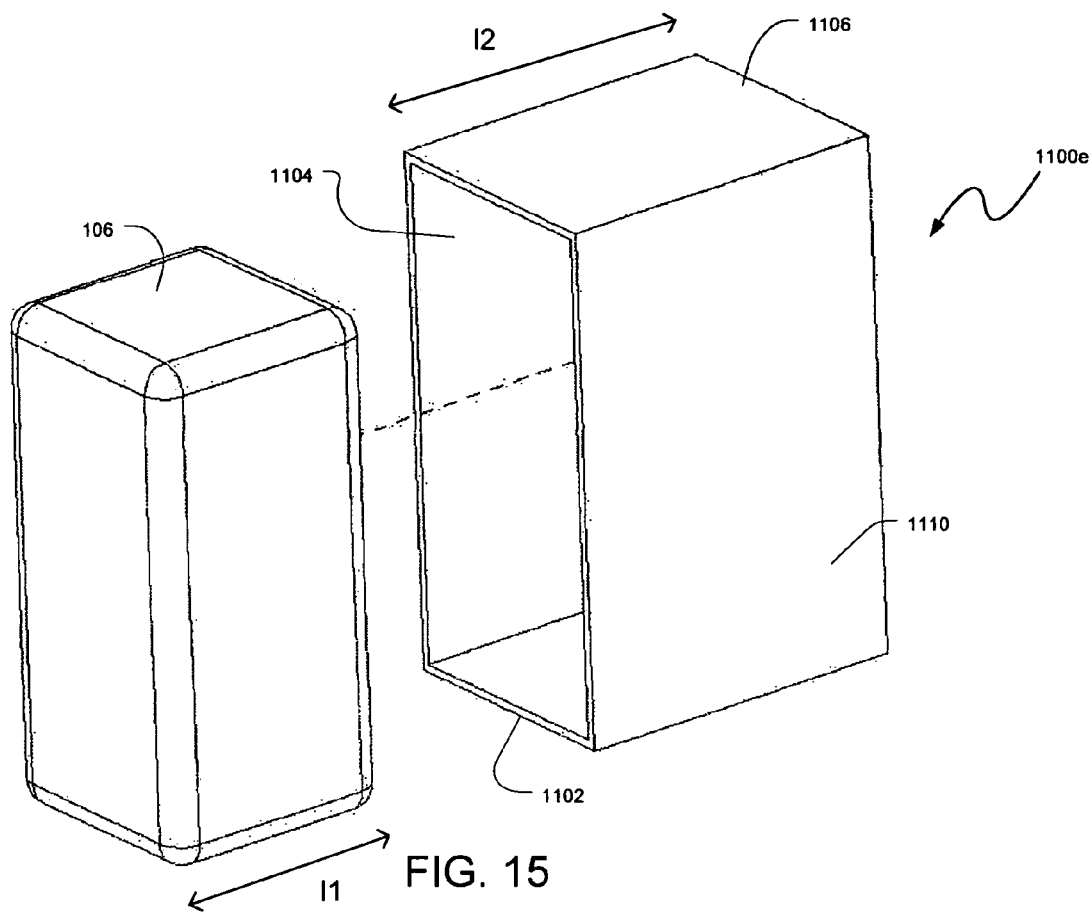
FIG. 15 is an exploded perspective view of the gas box of FIG. 1 having a gas box insulator system according to a fifth embodiment with five sides.
Figure 16:
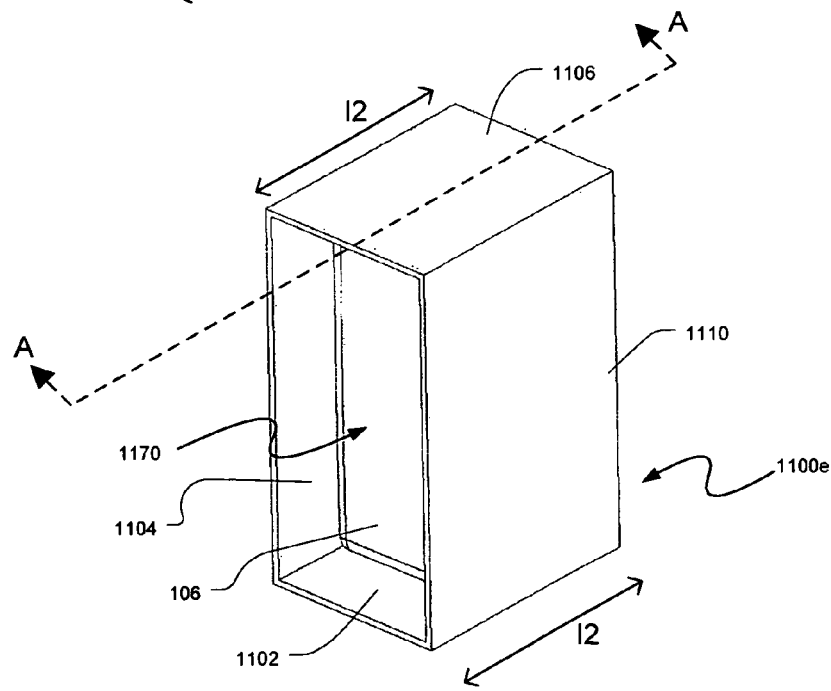
FIG. 16 is an assembled perspective view of the fifth embodiment of FIG. 15.
Figure 17:
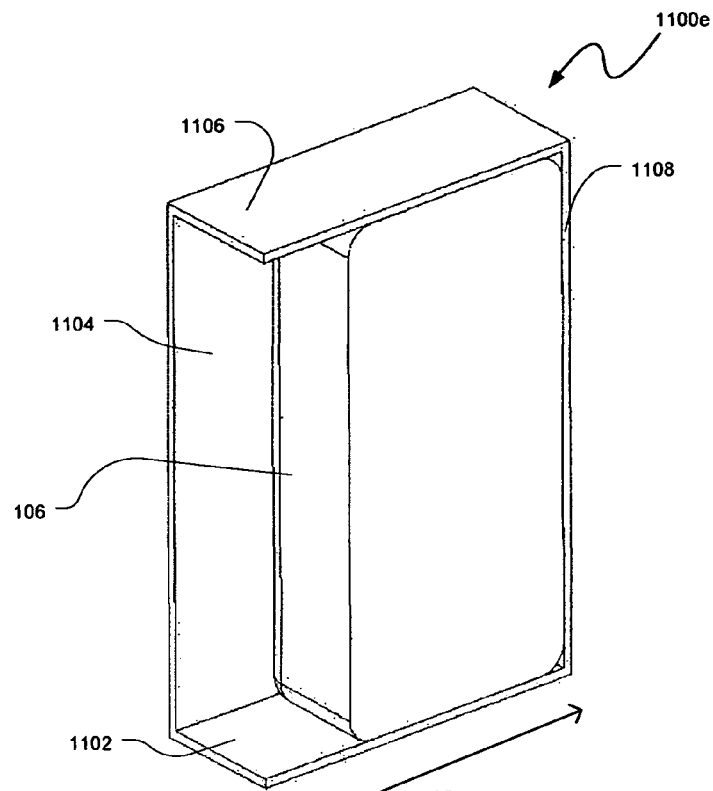
FIG. 17 is a cross sectional view taken along the line A-A of FIG. 16.

FIG. 15 is an exploded perspective view of the gas box of FIG. 1 having a gas box insulator system 1100e according to a fifth embodiment, while FIG. 16 is an assembled perspective view of the same. FIG. 17 is a cross sectional view of the assembled system taken along the line A-A of FIG. 16. The gas box insulator system 1100e of the fifth embodiment may include a solid insulator having five sides including the base 1102, the first upstanding sidewall 1104, the second upstanding sidewall 1110, the top 1106, and a rear upstanding sidewall 1108 (the rear sidewall 1108 is best seen in FIG. 17). Each of the sides 1102, 1104, 1106, 1108, 1110 may contact an associated exterior surface of the gas box 106.

The five sides 1102, 1104, 1106, 1108, 1110 may form an opening 1170 to give personnel access to the gas box 106. The length (12) of the first and second upstanding sidewalls 1104, 1110 as well as the length (12) of the base 1102 and top 1106 may be longer than the length (11) of the gas box 106 so that when the gas box 106 is inserted into the opening 1170, portions of each of the sides 1102, 1106, 1104, 1110 extend outward from an end of the gas box 106. This extension may provide for charge migration protection and, although not illustrated, the surfaces of the sides 1102, 1106, 1104, 1110 not proximate the gas box may be rippled or corrugated to enable the extension length to be decreased. Similarly, although not illustrated, the interior surfaces of other sides not proximate the gas box of all the embodiments of FIGS. 11 to 20 may also be rippled or corrugated to effectively increase the tracking length for a migrating charge.

The interior surfaces of the sides 1102, 1104, 106, 1108, 1110 proximate the gas box 106 may have a conductive portion (not illustrated), e.g., metal. Therefore, in some instances the interior surfaces of the sides proximate the gas box 106 may be referred to as being "metalized." The other portions of the sides not proximate the gas box may not be metalized, but rather may be rippled or corrugated to increase tracking length for a migrating charge. The interior surfaces of the other embodiments of the gas box insulator systems proximate the gas box may also be "metalized." In addition, the exterior surfaces of the gas box 106 may also be metalized to ensure a ground connection with no air voids.

Figure 18:
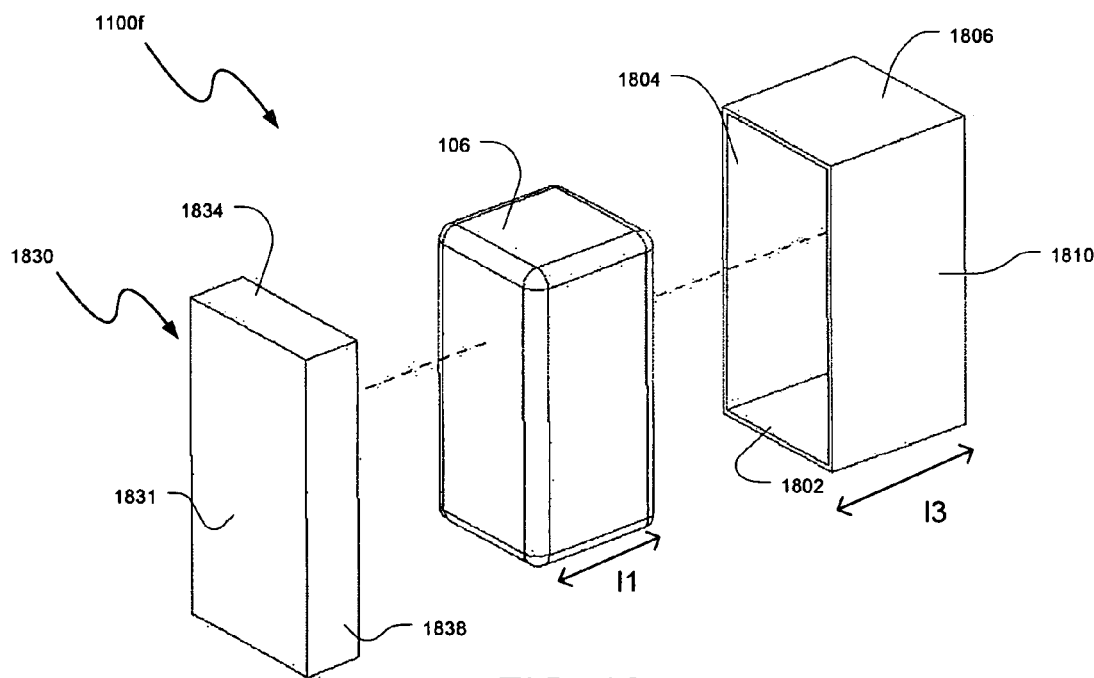
FIG. 18 is an exploded perspective view of the gas box of FIG. 1 having a gas box insulator system according to a sixth embodiment with six sides.
Figure 19:
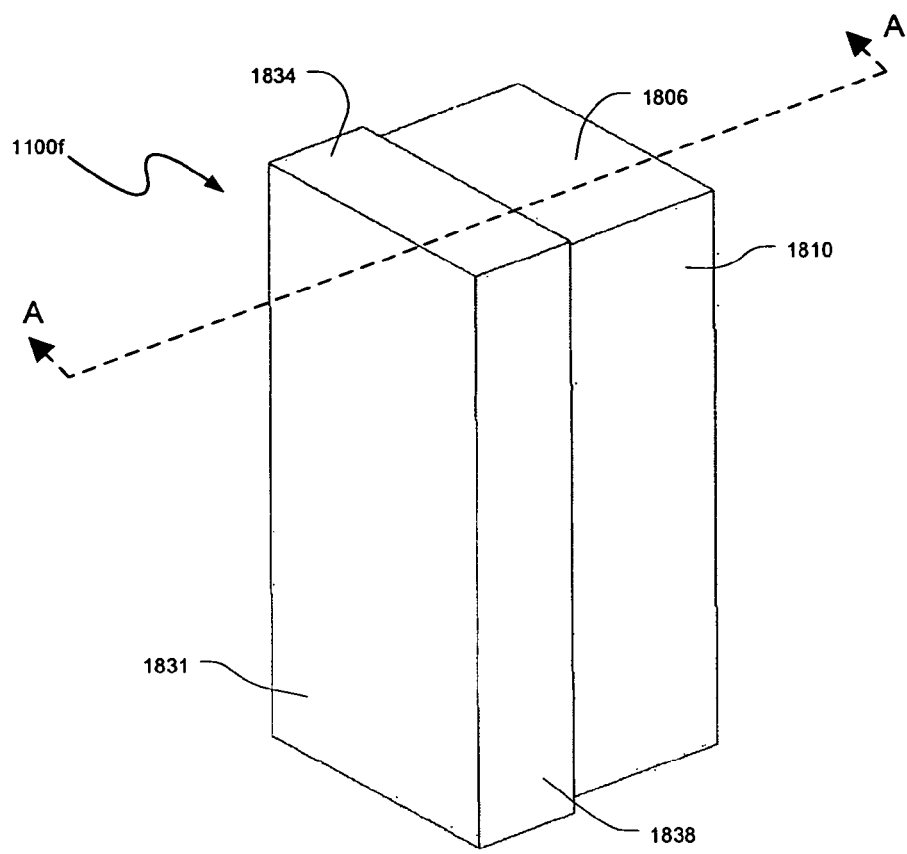
FIG. 19 is an assembled perspective view of the sixth embodiment of FIG. 18.
Figure 20:
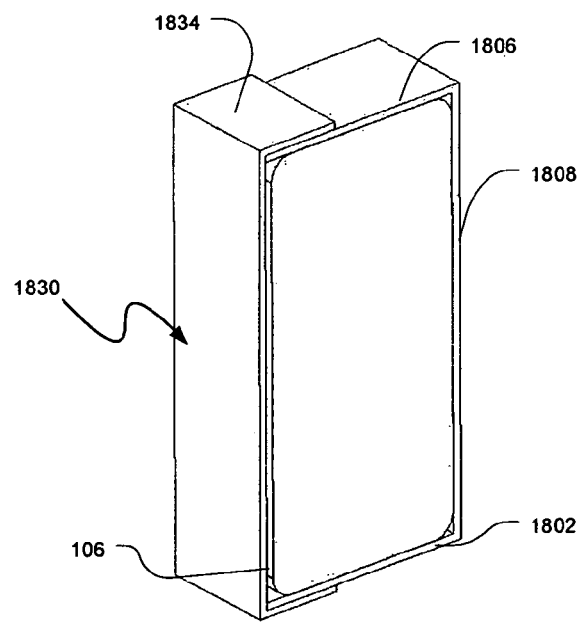
FIG. 20 is a cross sectional view taken along the line A-A of FIG. 19.

FIG. 18 is an exploded perspective view of the gas box of FIG. 1 having a gas box insulator system 1100f according to a sixth embodiment, while FIG. 19 is an assembled perspective view of the same. FIG. 20 is a cross sectional view of the assembled system taken along the line A-A of FIG. 19. The gas box insulator system 1100f of the sixth embodiment may include a solid insulator having five sides including a base 1802, a first upstanding sidewall 1804, a second upstanding sidewall 1810, a top 1806, and a rear upstanding sidewall 1808. Each of the sides 1802, 1804, 1806, 1808, 1810 may contact an associated exterior surface of the gas box 106.

The gas box insulator system 1100f may also include a removable cover 1830 that can be placed over the gas box 106 when the gas box is inserted into the opening formed by the five sides 1802, 1804, 1806, 1808, 1810. The removable cover 1830 enables the length (13) of the sidewalls 1804, 1810, the base 1802, and the top 1806 to be shorter than the length (12) of the fifth embodiment. The length (13) may be slightly longer than the length (11) of the gas box to enable the gas box to fit inside the cavity formed by the gas box insulator system 1100f. The removable cover 1830 may have portions that mate with associated portions of the sides to form a closed cavity when the removable cover 1830 is inserted onto the portions of the five sided structure. For example, portion 1834 may mate with the top 1806 and portion 1838 may mate with sidewall 1810.

Having thus described at least one illustrative embodiment, various alterations, modifications, and improvements will readily occur to those skilled in the art. Such alterations, modifications, and improvements are intended to be within and scope of the disclosure. Accordingly, the foregoing description is by way of example only and is not intended as limiting.

What is claimed is:

1. An ion implantation system comprising:
an ion source configured to provide an ion beam;
a terminal structure defining a cavity, said ion source at least partially disposed within said cavity; and
an insulator system to electrically insulate said terminal structure, said insulator system configured to provide an effective dielectric strength greater than about 72 kilovolts (kV)/inch in a region proximate at least one exterior surface of said terminal structure, wherein said insulator system comprises a solid insulator coupled to a junction of upstanding sidewalls with a top of said terminal structure.

2. The ion implantation system of claim 1, further comprising an acceleration power supply configured to energize said terminal structure to at least 200 kV.

3. The ion implantation system of claim 2, wherein said acceleration power supply is configured to energize said terminal structure to 600 kV.

4. The ion implantation system of claim 1, wherein said insulator system comprises another solid insulator coupled to a junction of the upstanding sidewalls with a bottom of said terminal structure.

5. The ion implantation system of claim 1, wherein said solid insulator comprises syntactic foam.

6. The ion implantation system of claim 1, wherein said solid insulator comprises polyethylene, polytetrafluoroethylene (PTFE), chlorinated polyvinyl chloride (CPVC), polyvinylidene difluoride (PVDF), silicone, or epoxy.

7. The ion implantation system of claim 1, wherein said solid insulator defines an internal cavity, and said insulator system further comprises a gas disposed in said internal cavity.

8. The ion implantation system of claim 7, wherein said gas comprises pressurized air.

9. The ion implantation system of claim 1, wherein a portion of the upstanding sidewalls forms a door, said door when open configured to provide access to said cavity of said terminal structure.

10. The ion implantation system of claim 1, further comprising a mass analyzer positioned downstream of said ion source, said mass analyzer configured to remove undesired species from said ion beam, and said ion implantation system further comprising a gas box configured to provide gas to be ionized in said ion source, said gas box also at least partially disposed within said cavity.

11. The ion implantation system of claim 10, further comprising a gas box insulator system configured to electrically insulate said gas box, said gas box insulator system comprising at least one insulator having a dielectric strength greater than about 72 kilovolts (kV)/inch.

12. The ion implantation system of claim 11, wherein said at least one insulator of said gas box insulator system comprises a solid insulator having at least one side contacting an associated exterior surface of said gas box.

13. An ion implantation system comprising:
an ion source configured to provide an ion beam;
a gas box configured to provide gas to be ionized in said ion source;
a terminal structure defining a cavity, said ion source and said gas box at least partially disposed within said cavity;
a terminal structure insulator system to electrically insulate said terminal structure, said terminal structure insulator system configured to provide an effective dielectric strength greater than about 72 kilovolts (kV)/inch in a region proximate at least one exterior surface of said terminal structure, wherein said terminal structure insulator system comprises a solid insulator coupled to a junction of upstanding sidewalls with a top of said terminal structure;
a gas box insulator system configured to electrically insulate said gas box, said gas box insulator system comprising a second solid insulator having at least one side contacting an associated exterior surface of said gas box;
a mass analyzer positioned downstream of said ion source, said mass analyzer configured to remove undesired species from said ion beam; and an end station positioned downstream of said mass analyzer, said end station comprising a platen having a surface to support a wafer thereon.

14. The ion implantation system of claim 13, wherein said second solid insulator of said gas box insulator system comprises a base, a first upstanding sidewall coupled to one end of said base, a second upstanding sidewall coupled to another end of said base, and a top coupled to said first and second upstanding sidewalls, wherein said base, said first and second upstanding sidewall, and said top contact associated exterior surfaces of said gas box.

* * * * *